United States Patent [19]

Rai-Choudhury

[11] 3,925,808

[45] Dec. 9, 1975

[54] SILICON SEMICONDUCTOR DEVICE WITH STRESS-FREE ELECTRODES

[75] Inventor: Prosenjit Rai-Choudhury, Murrysville, Pa.

[73] Assignee: Westinghouse Electric Corporation, Pittsburgh, Pa.

[22] Filed: Aug. 8, 1974

[21] Appl. No.: 495,755

[52] U.S. Cl. ........................ 357/67; 357/59; 357/68

[51] Int. Cl.$^2$ .................... H01L 23/48; H01L 29/44

[58] Field of Search ............................ 357/59, 67, 68

[56] References Cited

UNITED STATES PATENTS

| | | | |
|---|---|---|---|
| 3,588,632 | 6/1971 | Nakata | 357/67 |
| 3,664,896 | 5/1972 | Duncan | 357/59 |

*Primary Examiner*—John S. Heyman
*Assistant Examiner*—E. Wojciechowicz
*Attorney, Agent, or Firm*—C. L. Menzemer

[57] ABSTRACT

A silicon semiconductor device with stress-free electrodes is provided by using one or more silicon electrodes having impurity concentrations therethrough of greater than about $1 \times 10^{19}$ atoms/cm$^3$ and preferably greater than about $1 \times 10^{20}$ atoms/cm$^3$. The degenerate silicon electrodes are bonded to the silicon body through a solder layer formed by alloying with solder material selected from the group consisting of aluminum, aluminum-germanium alloy, aluminum-silicon alloy and germanium doped to greater than about $1 \times 10^{19}$ atoms/cm$^3$ therethrough with the silicon body at at least one major surface of preferably planar configuration. Preferably, the material is of silicon eutectic alloy to minimize metal penetration into the silicon body and in turn maintain the high blocking voltage capability of the device.

9 Claims, 5 Drawing Figures

SILICON SEMICONDUCTOR DEVICE WITH STRESS-FREE ELECTRODES

FIELD OF THE INVENTION

The present invention relates to semiconductor devices and particularly high power silicon semiconductor devices.

BACKGROUND OF THE INVENTION

Silicon power semiconductor devices are generally produced by diffusion and less frequently by epitaxial growth of semiconductor bodies. The semiconductor body is mounted usually by thin foil brazing or soldering material to a metal electrode which supports the body and acts as a heat sink for and electrical conductor to the semiconductor body. The composite assembly (sometimes called a "fusion") is thereafter packaged in a hermetically sealed container. Such electrodes must provide good electrical and thermal contact to the semiconductor body. That is, both electrical and thermal resistance must be minimized to reduce electrical power losses and avoid premature failure of the semiconductor device. These factors become increasingly important as the power capacity of the device increases.

Generally the device consequences of joining silicon to the metal electrode has been three-fold: The stresses, cracks and voids at the interfacial joint between the silicon and the electrode causes a substantial increase in forward voltage drop of the device. The stresses in the silicon body cause buckling and bowing of the composite assembly (or fusion) that increases the thermal impedance at the interfacial joint between the electrode and pole piece. And stresses in the silicon body cause microcracks particularly toward the center of the body which severely limit the blocking voltage of the device and reduce the useful life of the device.

Specifically, the primary difficulty stems from difference in thermal expansion between the metal contact and the silicon body, which introduces interfacial stresses and bulk stresses in the silicon. The interfacial stresses are held in equilibrium by constraining shear stress in the solder layer (of highly expansible material) and electrode. The shear stress at the silicon interface increases exponentially toward the peripheral edge of the silicon body, and the eventual fracture originates at the interface and propagates from the edge of the silicon body. Chance of failure by this mechanism becomes exponentially greater as the diameter of the silicon body increases.

The bulk stresses in the silicon tend to buckle or bow the body so that the upper major surface is convex. These stresses are held in equilibrium by forces normal to the interfacial solder layer applying tension at the center and/or compression at the periphery of the silicon body. Such forces are compensated by providing a very thick metal electrode, or sandwiching the silicon body between two symmetrical metal electrodes. However, the silicon body is usually sandwiched between two asymmetrical metal electrodes, and the tension near the center of the body builds to the fracture stress of silicon (about $2 \times 10^9$ dynes/cm$^2$; see Sylwestrowicz, Phil. Mag. Sec. 8, 7, 1825 (1962)), causing microcracks to form at the center of the silicon body.

Accordingly, the maximum diameter of silicon that can be mounted is inversely proportional to the difference in the thermal expansion coefficients ($\Delta \alpha$) of the silicon and the metal electrode, and the difference in temperature ($\Delta T$) between solidification temperature of the solder and the operating temperature of the semiconductor device. However, the higher the current capacity of the device, the larger the diameter of the silicon semiconductor body. Body diameters of 2 inches are now commercially used, and body diameters of 3 inches and more are shortly expected. Yet, known technology in contacting has practically limited the size of the silicon bodies which can be packaged as devices.

The most commonly utilized electrodes have been molybdenum (Mo) and tungsten (W). Molybdenum and tungsten of the pure metals have the thermal expansion coefficients closest to silicon. Selection is limited to pure metals because of the need for high thermal conductivity properties. Molybdenum and tungsten are, however, not easily wettable materials. Consequently, the soldering is normally performed at a relatively high temperature (i.e. 700° to 800°C) using aluminum or aluminum-silicon thin foil preforms. The molybdenum or tungsten electrode is thus bonded to the silicon body by alloying through the formation of silicides, the silicon being supplied from the silicon body, or the preform, or both. The silicon-rich alloy is deposited as an interfacial layer of regrown epitaxial material.

However, for alloying a 2-inch diameter silicon fusion to a molybdenum or tungsten electrode, the allowable $\Delta T$ is about 400°C without bowing or buckling of the fusion. Therefore, aluminum and aluminum-silicon alloys could not be satisfactorily utilized. Instead, gold-tin, gold-silicon, gold-platinum, gold-germanium and like alloys could be used for soldering such devices. But such solder preforms are very expensive. Moreover, use of such low temperature solder almost invariably necessitates further treatment of the surfaces to be joined so that a void-free bonding joint is provided.

The present invention overcomes these disadvantages and difficulties of the prior devices. It provides a semiconductor device with a minimum of internal stress in the semiconductor body and at the interface to the semiconductor body, and in turn a semiconductor device with improved electrical characteristics and low thermal impedance and a long life.

SUMMARY OF INVENTION

A silicon semiconductor device is provided with stress-free electrodes. The resulting device is provided with electrodes with both low thermal resistance and low electrical resistance and, in turn, improved electrical characteristics of particularly reduced forward voltage drop, higher surge capability, and lower power loss. Further, the device has reduced microcracking in the silicon body which maintains the reverse blocking voltage and extends the useful life of the device.

The semiconductor device is made by first forming a silicon semiconductor body having opposed major surfaces of preferably planar configuration and containing impurity regions of different conductivity type to impart desired electrical characteristics for the device. That is, the PN junctions are formed in the semiconductor body by diffusion and/or epitaxial techniques to provide a rectifier, transistor, thyristor, FET, or other desired device.

The silicon body is then contacted at at least one major surface adjoining a given impurity region with a solder material selected from the group consisting of aluminum, aluminum-silicon alloy, aluminum-germanium alloy, and germanium doped to greater than about $1 \times 10^{19}$ atoms/cm$^3$ therethrough. Thereafter, the solder material is contacted with a degenerate silicon electrode having an impurity concentration therethrough greater than about $1 \times 10^{19}$ atoms/cm$^3$ and preferably greater than about $1 \times 10^{20}$ atoms/cm$^3$. By this arrangement, the silicon body can be mounted on and bonded to the electrode forming an ohmic contact without shortcircuiting the device.

The assembly is then heated preferably to a temperature greater than 675°C in a hydrogen atmosphere to alloy the electrode to the silicon body through a solder layer formed from the solder material. Preferably, the solder material is a silicon eutectic alloy (e.g. aluminum - 11.7 percent by weight silicon) so that the silicon of the solder layer is obtained primarily from the solder material. Penetration of the metal in the silicon semiconductor body is thus minimized and the electrical characteristics originally provided in the semiconductor body can be uniformly maintained.

Other details, objects and advantages of the invention will become apparent as the following description of the presently preferred embodiments and presently preferred methods for making the same proceeds.

BRIEF DESCRIPTION OF THE DRAWINGS

In the accompanying drawings are illustrated the preferred embodiments of the invention and preferred methods of practicing the same, in which.

DESCRIPTION OF THE PREFERRED EMBODIMENTS

Figure 1:
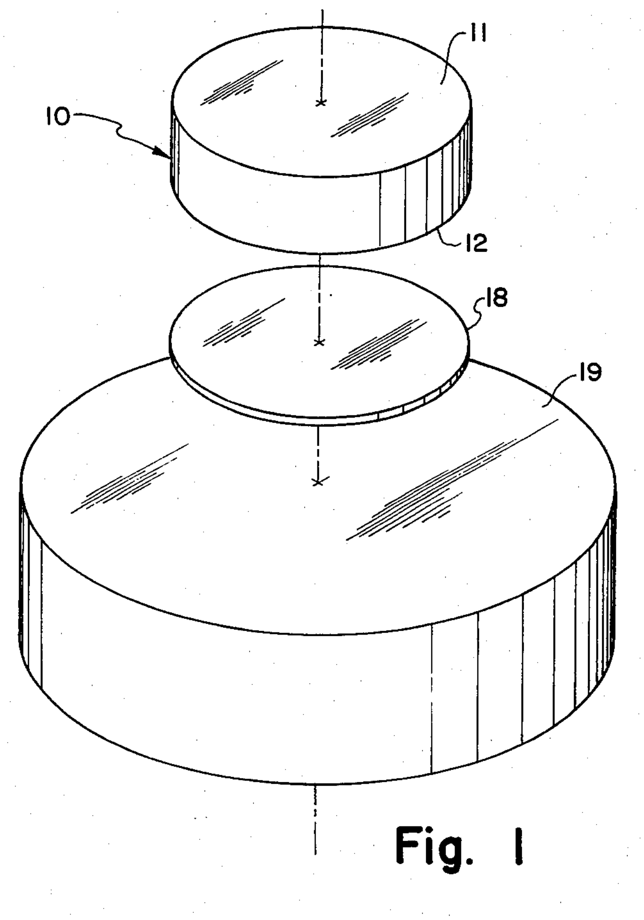
FIG. 1 is an exploded view in perspective of the components of the semiconductor device in accord with the present invention.
Figure 2:
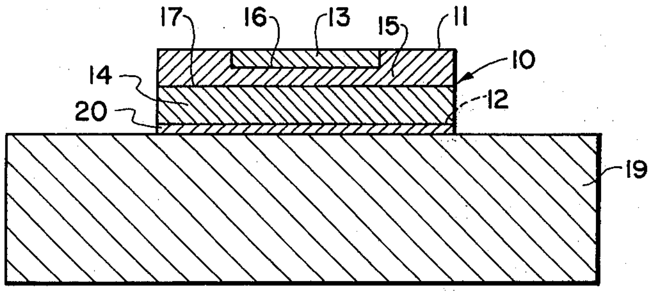
FIG. 2 is a cross-sectional view in elevation of the assembled semiconductor device shown in FIG. 1.

Referring to FIGS. 1 and 2, a silicon semiconductor device is shown having substantially stress-free structures. Silicon body 10 has opposed major surfaces 11 and 12 preferably of planar configurations. Silicon body 10 is preferably a single crystal of float zone or Czochralski silicon.

Silicon body 10 contains impurity regions of different conductivity type, i.e. N-type or P-type, to impart desired electrical characteristics to the device. For purposes of illustration, the semiconductor body shown in a junction transistor having emitter and collector impurity regions 13 and 14 of the same conductivity adjoining major surfaces 11 and 12, respectively, and base impurity region 15 of the opposite conductivity type between the emitter and collector regions in the interior of body 10 and adjoining major surface 11 peripherally of emitter impurity region 13. PN junction 16 is thus formed between emitter region 13 and base region 15, and PN junction 17 is formed between collector region 14 and base region 15. Alternatively, any suitable semiconductor body may be utilized such as a diode, thyristor, diac, triac, FET, MOSFET, etc.

Solder preform 18 is preformed of a solder material selected from the group consisting of aluminum, aluminum-silicon alloy, aluminum-germanium alloy and germanium doped greater than about $1 \times 10^{19}$ atoms/cm$^3$. Preferably preform 18 is a metal silicon eutectic alloy i.e. aluminum-silicon or aluminum-germanium, so that the alloying temperature, e.g. about 600°C., is as low as possible and non-uniform and deep penetration of the metal of the alloy into the silicon body is minimized. In any case, the preform is typically a thin foil of between about 1 and 2 mils.

Solder preform 18 is placed in contact with major surface 12. The configuration of preform 18 is such that the preform contacts only the area of major surface 12 adjoining collector impurity region 14 so that the device is not short-circuited by the electrodes as hereinafter described. The configuration may be in any form, irregular or regular, symmetric or asymmetric. For purposes of illustration, the solder preform is in the shape of a circular disc as shown in FIG. 1.

Alternatively, instead of utilizing a preform, the solder material may be contacted to the major surfaces of semiconductor body 10 by any suitable techniques. Examples of suitable alternative techniques are vapor deposition, sputter deposition and chemical deposition.

Electrode 19 is also formed of a silicon in a single-crystal, or polycrystalline form, produced by any convenient technique such as the Czochralski process or casting. As formed, the electrode is of degenerate silicon having an impurity concentration therethrough greater than about $1 \times 10^{19}$ atoms/cm$^3$ and preferably greater than $1 \times 10^{20}$ atoms/cm$^3$. Electrode 19 is of a thickness preferably between 50 and 60 mils to provide good structural support for silicon body 10 and a good heat sink for silicon body 10.

Electrode 19 is placed in contact with solder preform 18. Its configuration, which is typically cylindrical, generally extends beyond the periphery of silicon body 10 as shown in FIG. 2. In this connection, it should be noted that each electrode is preferably doped with impurities of the same conductivity as the impurity region or regions of the semiconductor body to which the electrode is bonded; however, this feature is not necessary to the operation of the invention because any PN junction that is formed has a very low breakdown voltage (i.e. less than 1 volt) that is of no significant consequence in the operation of the device.

The assembly is then heated preferably in a hydrogen atmosphere such as preferably to a temperature between 675° and 700°C. The solder material is thus alloyed with the silicon body 10 and the silicon electrode 19 to form a silicon-rich solder layer 20, as shown in FIG. 2, which bonds electrode 19 to silicon body 10. Preferably the solder material is of a silicon eutectic alloy so that a minimal amount of the silicon for solder layer 20 comes from the silicon body. In this way, the impurity concentration distribution originally provided in silicon body 10 can be maintained, and the electrical characteristics of the semiconductor device can be maintained. Also, the quantative yield of the completed semiconductor devices can thus be increased.

The resulting semiconductor device is substantially stress-free. Both semiconductor body 10 and electrode 19 being of silicon, there is no difference in thermal expansion coefficient (i.e. $\Delta\alpha = 0$), and, in turn, $\Delta T$ is no longer a critical parameter. Interfacial stresses between electrode 19 and semiconductor body 10 and buckling and bulk microcracks of the silicon body 10 are avoided. Further, thermal diffusivity of silicon is 0.9 $cm^2$/sec. at 20°C, which may be compared with 0.54 $cm^2$/sec. for molybdenum and 0.63 $cm^2$/sec. for tungsten at 20°C. Thus for a given transient heat pulse, the wave will propagate faster through the silicon electrode than through molybdenum or tungsten. However, silicon has relatively low heat capacity. For this reason, the thickness of the silicon electrode should be minimized and intimate physical contact should be established between the silicon electrode and the copper pole piece.

Figure 3:
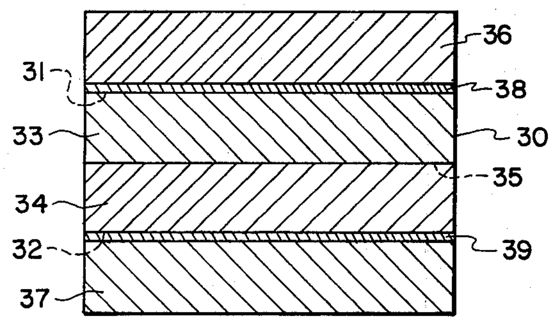
FIG. 3 is a cross-sectional view in elevation of an alternative semiconductor device in accord with the present invention.

Referring to FIG. 3, semiconductor device with electrodes on both major surfaces of the silicon semiconductor body can also be prepared by the present invention. When electrodes made of other materials such as molybdenum or tungsten are alloyed to both major surfaces of a silicon body, cracking and fracture of the silicon body is almost certain.

Silicon semiconductor body 30 having major surfaces 31 and 32 of planar configuration has N-type impurity region 33 adjoining major surface 31 and P-type region 34 adjoining major surface 32, with PN junction 35 therebetween. A silicon rectifier is thus formed. Alternatively, the semiconductor body may contain impurity regions of different conductivity type to impart any given desired electrical characteristics, e.g. a transistor or thyristor.

Major surfaces 31 and 32 are contacted by suitable solder material selected from aluminum, aluminum-silicon alloys, aluminum-germanium alloys and germanium doped to greater than about $1 \times 10^{19}$ atoms/$cm^3$ therethrough, and most preferably a silicon eutectic alloy. The solder materials are then contacted with electrodes 36 and 37 of degenerate silicon having an impurity concentration therethrough greater than about $1 \times 10^{19}$ atoms/$cm^3$ and preferably greater than about $1 \times 10^{20}$ atoms/$cm^3$. Thereafter, the assembly is heated as above described to alloy electrodes 36 and 37 to silicon body 30 through solder layers 38 and 39, respectively.

Semiconductor devices such as described in FIGS. 1–3 have improved electrical characteristics. Specifically, the surge current rating of the device is increased because of stress free construction, and the thermal characteristics of the device are improved because larger diameter devices and flatter surfaces can be fabricated and maintained.

Furthermore, in any embodiment of the present invention the forward voltage drop of the semiconductor device due to the silicon electrode is negligible compared to the overall forward voltage drop of semiconductor device. This fact can be illustrated by the following calculation for a device similar to the one shown in FIGS. 1 and 2 with a rectifier silicon body.

Consider a 2-inch diameter silicon body having applied thereto a surge current of $1 \times 10^4$ amps for one cycle of a 60-cycle signal. The resistivity of the silicon electrode is given as $1 \times 10^{-3}$ ohm-cm, and the thermal diffusion coefficient of silicon ($\alpha Si$) is 0.9 $cm^2$/sec. Further, an electrode of a thickness equal to the diffusion length at single 60 Hz pulse is selected, $$\text{i.e. electrode thickness}(X_e) = (\alpha_{Si} t)^{1/2} = \left(\frac{0.9\ cm^2}{sec} \times \frac{1}{60} sec\right)^{1/2}$$
$$= 0.122\ cm = 48\ mils$$

It should be noted that the same calculation for copper yields an electrode of 54 mils.

The contribution of the silicon electrode to forward voltage drop can then be calculated using the thickness of the silicon electrode:

$$V_f\ (\text{of the electrode}) = \frac{I_s \rho X_e}{\pi r^2} = \frac{(1 \times 10^4 amps)\ (0.122\ cm)\ (1 \times 10^{-3}\ ohm\text{-}cm)}{314 \times (2.54\ cm)^2}$$
$$= \frac{(1 \times 10^4)\ (1.22 \times 10^{-1})\ (1 \times 10^{-3})}{2.03 \times 10^1} = 0.06\ volts$$

Under normal operating conditions, a 2-inch rectifier will carry a current of about 1500 amps with a forward drop of 2.0 volts. The contribution due to the electrode under steady state conditions would then be 0.01 volts, which is negligible by comparison.

To illustrate the invention, 2-inch diameter rectifiers (3400 volts at 5mA) and thyristors ($V_{DRM} \approx 1750$ volts at $\leq$ 1mA; $V_{RRM} \approx 1750$ volts at 5mA) were fabricated using aluminum preforms and silicon electrodes having a boron concentration therethrough of about $1 \times 10^{20}$ atoms/$cm^3$. Alloying was carried out in a belt furnace with a hydrogen ambient at about 675°C.

These devices exhibited no interfacial stresses, voids and/or buckling that would contribute to increased forward voltage drop and increased thermal impedance, and no bulk microcracks that would contribute to reduced blocking voltage. All devices withstood 5000 pounds of force applied to the package pole faces, and underwent minimal chipping during subsequent bevel lapping.

Similarly, 3-inch diameter silicon rectifiers were alloyed to molybdenum, tungsten, and silicon electrodes using aluminum preforms. Some silicon rectifiers were also alloyed to silicon electrodes using aluminum-silicon eutectic preforms. The silicon electrodes all had an impurity concentration of boron therethrough of about $1 \times 10^{20}$ atoms/$cm^3$. Alloying was carried out in a belt furnace with a hydrogen ambient of about 675°C.

The devices alloyed with molybdenum electrode were excessively strained, with 12 mils bowing for 60 mils molybdenum electrodes. The devices alloyed with tungsten electrode were found to sometimes fracture during subsequent heat treatment. The devices alloyed with degenerate silicon electrodes using aluminum preforms were found to be stress free, but to have low blocking voltage capability (i.e. < 500 volts); the latter is believed to be because of the localized aluminum penetration that reduced the effective base width of the rectifier. The devices alloyed with degenerate silicon electrodes using aluminum-silicon eutectic preforms were found to be stress-free and all exhibit blocking voltages greater than 1200 volts.

To further illustrate the invention, 3-inch diameter rectifiers were made using [111] Czochralski silicon and [100] float-zone silicon. Most of the silicon wafers were doped N-type with phosphorus to an impurity concentration of $1 \times 10^{14}$ atoms/$cm^3$ therethrough.

Some of the float-zone silicon wafers were lighter doped N-type with phosphorus to an impurity concentration of $5 \times 10^{13}$ atoms/cm$^3$ therethrough.

Figure 4:
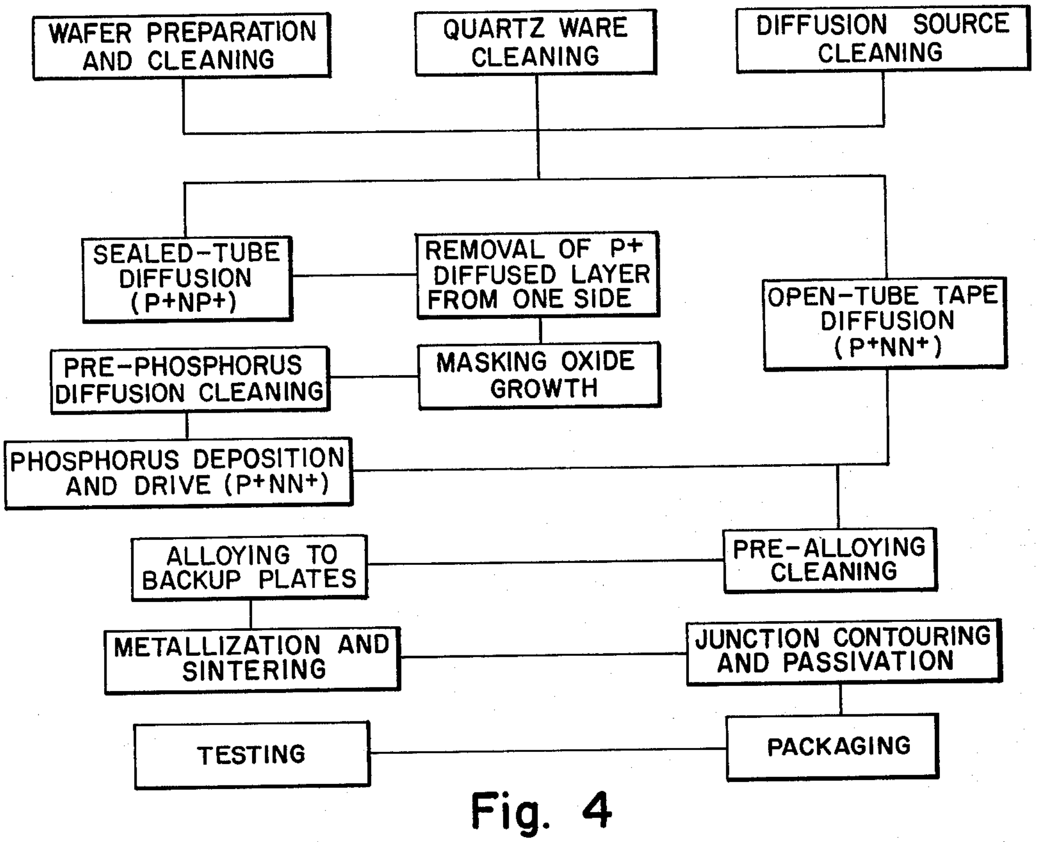
FIG. 4 is a flow chart showing the process steps for the fabrication of 3-inch rectifiers in accordance with the present invention.

Referring to FIG. 4, the silicon bodies were fabricated into rectifiers using the process steps there described. As shown by FIG. 4, some P+NN+ rectifier structures were made using the single step open-tube diffusion method described in my copending application Ser. No. 498,016, filed Aug. 16, 1974. The other P+NN+ rectifier structures were made by a conventional diffusion technique comprising (i) a closed-tube boron-aluminum-gallium diffusion, (ii) removal of the P+ layer at one major surface of the body, and (iii) an open-tube diffusion using $PH_3$ as the diffusion source.

The diffused silicon bodies were then alloyed to electrodes of degenerate silicon with aluminum and aluminum-silicon eutectic alloy preforms. The silicon electrodes each had a boron impurity concentration therethrough of $1 \times 10^{20}$ atoms/cm$^3$. Alloying was performed in a belt furnace in a hydrogen ambient of 700°C.

The resulting semiconductor devices were all extremely flat, i.e. no bowing was observed as is generally introduced when alloying with molybdenum or tungsten electrodes. In this connection, it should be noted that the contact pressure is probably the most important factor affecting the matching configuration of electrodes with pole pieces due to deformation of at least one of the surfaces thereof. The more intimately the surface match, the greater will be the conductance (thermal and electrical). Flatness is therefore believed very important, and more so than the surface finish.

The flatness of the device and internal stresses were further examined by subjecting the devices to loads up to 14,000 pounds force between two copper pole pieces, and measuring the forward voltage drop under surge conditions. Silver foil of 5 mils in thickness was placed between the device and the pole pieces to provide good electrical and thermal contact.

Forward voltage drop tests were conducted at temperatures of 25°C and 125°C with both increasing and decreasing pressure loading. In addition, current densities of 280 amps/cm$^2$ and 730 amps/cm$^2$ were utilized. In order to make the desired electrical measurements without causing undue heating, individual half cycles of current were applied to the device separated by several minutes elapsed time between cycles, so that the junction temperature of the fusion under test was 25°C at the beginning of each half cycle of forward current. Since electrical measurements had to be made during single half cycles of current, an instrumentation system employing sample-and-hold circuits was used. The peak value of forward current was sensed by a peak detecting circuit and then stored in a sample-and-hold circuit. At the instant when the peak value of current was reached, a sample-and-hold circuit was gated to detect and store the instantaneous value of forward voltage. When the test was concluded, the values of the parameters stored in the sample-and-hold circuits were printed out on paper tape.

Figure 5:
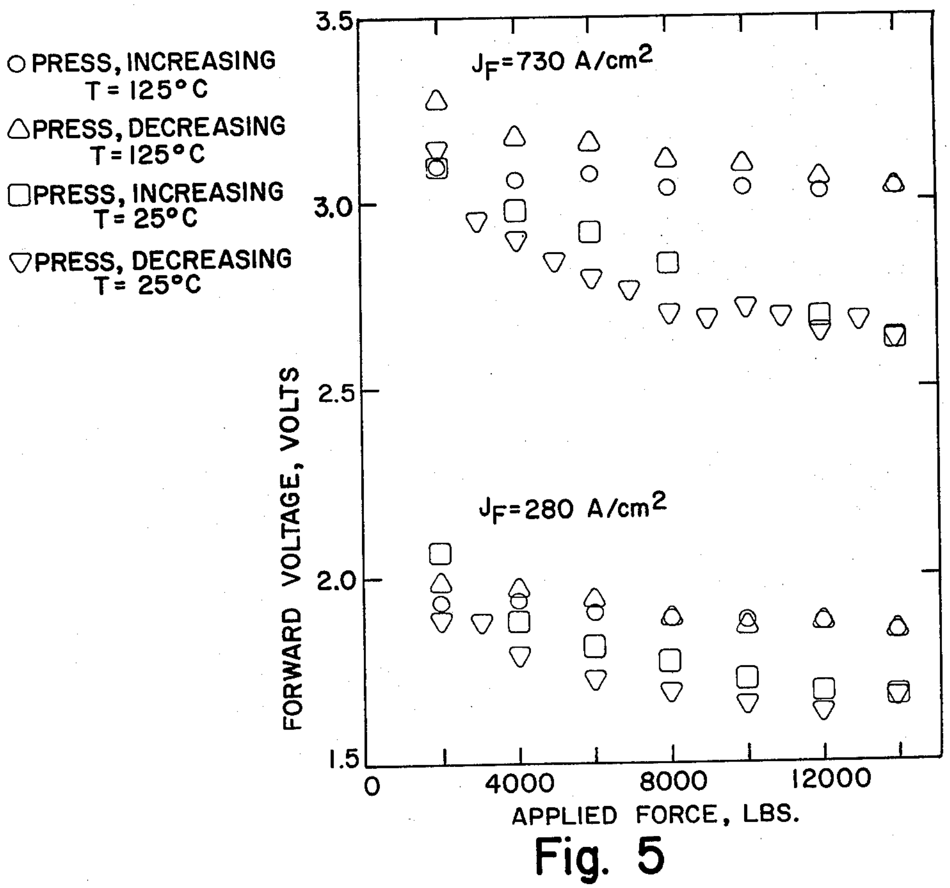
FIG. 5 is a graph showing the effect of pressure loading on the forward voltage drop of the 3-inch rectifiers made in accordance with FIG. 4.

The results of the tests are shown in FIG. 5. Forward drops for increasing pressure are somewhat different from those for decreasing pressure because of localized plastic deformation of the silver foils at points of contact. And, increased pressure sensitivity of forward drop with increasing current density is apparent. However, an increase in the applied load from 6000 pound force to 14,000 pound force causes an increase in the forward voltage drop of only 0.03 V at 10,000 A (~ 280A/cm$^2$) and 0.11 V at 26,000 A (~ 730 A/cm$^2$) at a junction temperature of 125°C. It is, therefore, concluded that the device structure was substantially free of interfacial and bulk stresses. Further, it is seen that use of 6000 pound force is quite adequate for many applications, and consequently simplifies the encapsulation problem, in that, existing flat pack type designed packages can be used with some modification.

Thermal resistance $R_\Theta$, of the devices was measured by conventional techniques using a hydraulic press with provisions for external heating and cooling. Temperature dependence of the forward voltage at a fixed metering current was used as a reasonably reliable indicator of the junction temperature ($T_j$). The case temperature ($T_c$) was directly measured by a thermocouple. To perform the measurements, d.c. current was passed through the device in the forward direction to produce the desired heat generation by power dissipation. After thermal equilibrium was reached, the large heating current in the device under test was suddenly commutated off, and the low level metering current was once again established. By observation of the initial value of the device forward drop due to the metering current just after the heating was removed, the junction temperature during the power-heat dissipation period was determined. From this data, the steady state thermal resistance was calculated using the following equation:

$$R_{\Theta JC}(t) = \frac{T_j(t) - T_c}{VI}$$

The thermal resistance of the 3-inch rectifiers was measured at two different levels of clamping force, 10,000 pounds and 14,000 pounds. The results were as follows:

| Clamping Force, lbs. | Thermal Resistance, °C/W |
|---|---|
| 10,000 | .016 |
| 14,000 | .014 |

As expected, thermal resistance decreased with increasing clamping force. By comparison with measurements made on smaller devices, these values of thermal resistance are reasonable assuming that thermal resistance varies as the reciprocal of device area. Stated another way, on a unit area basis, these values of thermal resistance are comparable to that of smaller diameter devices.

While presently preferred embodiments of the invention have been specifically described, it is distinctly understood that the invention may be otherwise variously embodied and used within the scope of the following claims.

What is claimed is:

1. A silicon semiconductor device comprising:

A. a silicon semiconductor body having opposed major surfaces and containing impurity regions of different conductivity types to impart given electrical characteristics to the device;

B. at least one electrode of silicon doped therethrough to an impurity concentration of greater than about $1 \times 10^{19}$ atoms/cm$^3$ ; and C. at least one solder layer, said solder layer being disposed between and bonding together the silicon body and the electrode of silicon in intimate electrical and mechanical contact, said solder layer formed by alloying a solder material with the silicon body and the electrode of silicon, said device being so constructed and arranged that at least one of the opposed major surfaces of the silicon body is in its entirety in intimate contact with the electrode of silicon.

2. A silicon semiconductor device as set forth in claim 1 wherein:

said solder material is selected from the group consisting of aluminum, aluminum-silicon alloy, and aluminum-germanium alloy.

3. A silicon semiconductor device as set forth in claim 1 wherein:

each electrode has an impurity concentration therethrough of greater than about $1 \times 10^{20}$ atoms/cm$^3$.

4. A silicon semiconductor device as set forth in claim 3 wherein:

said solder material is selected from the group consisting of aluminum-silicon and aluminum-germanium eutectic alloy.

5. A silicon semiconductor device as set forth in claim 1 wherein:

said solder layers are formed at both opposed major surfaces of the silicon body, and said electrodes are bonded to the silicon body by the solder layer at both opposed major surfaces of the silicon body.

6. A silicon semiconductor device as set forth in claim 5 wherein:

each electrode has an impurity concentration therethrough of greater than about $1 \times 10^{20}$ atoms/cm$^3$.

7. A silicon semiconductor device as set forth in claim 5 wherein:

said solder material is selected from the group consisting of aluminum-silicon and aluminum-germanium eutectic alloy.

8. A method of making a semiconductor device comprising the steps of:

A. forming a silicon semiconductor body having opposed major surfaces with impurity regions of different conductivity type to impart given electrical characteristics to the body;

B. contacting substantially the entire area of at least one major surface of the silicon body with a solder material selected from the group consisting of aluminum, aluminum-silicon alloy and aluminum-germanium alloy;

C. contacting said solder material with an electrode of silicon doped therethrough to an impurity concentration of greater than about $1 \times 10^{19}$ atoms/cm$^3$; and D. heating the silicon body with the contacting solder material and electrode to bond the electrode in intimate electrical mechanical contact to the silicon body by the solder material.

9. A method of making a semiconductor device as set forth in claim 8 wherein:

solder material and subsequently electrodes are contacted, and simultaneously bonded at both opposed major surfaces of the silicon body, and the conductivity type of each electrode of silicon is compatible with the adjacent impurity regions in the silicon body.

* * * * *